United States Patent [19]

Franck

[11] Patent Number: 5,412,344
[45] Date of Patent: May 2, 1995

[54] CLASS AB AMPLIFIER WITH IMPROVED PHASE MARGIN

[75] Inventor: Stephen J. Franck, Felton, Calif.

[73] Assignee: GEC Plessey Semiconductor, Inc., Scotts Valley, Calif.

[21] Appl. No.: 155,584

[22] Filed: Nov. 19, 1993

[51] Int. Cl.$^6$ .............................................. H03F 3/45
[52] U.S. Cl. ...................................... 330/255; 330/292
[58] Field of Search ............... 330/253, 255, 257, 264, 330/292

[56] References Cited

U.S. PATENT DOCUMENTS 4,963,834  10/1990  Yukawa ............................ 330/255 X
5,039,953   8/1991  Su ..................................... 330/255 X

*Primary Examiner*—Steven Mottola
*Attorney, Agent, or Firm*—Leo V. Novakoski; Dennis S. Fernandez

[57] ABSTRACT

An amplifier circuit providing high power efficiency and an improved phase margin includes a transconductance input stage, one output of which is connected to an input of a class AB amplifier gain stage to form a compensation node, and the other output of which drives a current gain means, with the outputs of the current gain means and the class AB amplifier forming a current summing output node that is coupled to the compensation node through a compensation capacitor. The phase margin of the amplifier circuit is optimized by selecting the gain of the current gain means to be approximately equal to one plus the ratio of the capacitance of the load to the capacitance of the compensation capacitor.

12 Claims, 4 Drawing Sheets

CLASS AB AMPLIFIER WITH IMPROVED PHASE MARGIN

TECHNICAL FIELD

This invention relates to the field of amplifier circuits and in particular to the field of amplifier circuits capable of providing both high power efficiency and high phase margins.

BACKGROUND OF THE INVENTION

It is well known that class AB amplifiers are superior to transconductance amplifiers for efficiently providing high DC power to loads, due to the ability of class AB amplifiers to source and sink DC currents on demand. Transconductance amplifiers on the other hand have superior phase margins, which minimize the time lag between application of a differential voltage to the amplifier input and the resulting slew rate of the voltage at the amplifier output in response to the input signal. Phase margins of 90° are typical for transconductance amplifiers, allowing operation at higher slew rates with limited signal distortion and overshoot.

Generally, circuit designers requiring amplifiers suitable for both high frequency operation and providing high DC currents must settle for higher signal distortion, lower power operation, or narrower operating bandwidths. For example, the addition of a pole-splitting compensation capacitor, $C_c$, to a class AB amplifier that drives a capacitive load, $C_1$, moves the second pole to a higher frequency, but compromises the unity gain bandwidth of the amplifier. To improve the phase margin, the second pole, $g_{m2}/C_1$, must exceed the unity feedback frequency, $g_{m1}/(Av\ C_c)$ by the desired gain margin. The compensation capacitor limits the bandwidth over which the amplifier can operate in order to increase the capacitive loads that the amplifier can drive. For higher bandwidth, the amplifier must dissipate more power.

Transconductance amplifiers, while providing stable, fast response, may also translate a DC load current into an input offset voltage. Thus, there is a need for an amplifier circuit that can both provide power for DC loads and handle high frequency signals with minimal distortion.

SUMMARY OF THE INVENTION

In accordance with the present invention, an amplifier circuit provides the DC current sourcing capability of a class AB amplifier with the high phase margin of a transconductance amplifier. In accordance with the present invention, an amplifier circuit includes a transconductance amplifier input stage having a pair of outputs, one of which drives a class AB gain stage and the other of which drives a current gain means. An output of the class AB gain stage and the output of the current gain means are connected to form a current summing node which is the output of the amplifier circuit. A compensation capacitor is connected between the current summing node and the compensation node formed by the common connection of the input of the class AB gain stage and the output of the transconductance amplifier input stage. The compensation capacitor couples AC signals directly to the current summing node and provides feedback from the current summing node to the compensation node.

The class AB gain stage driven by the transconductance amplifier input stage of the present invention provides DC current sourcing and sinking capability that is not available from a transconductance amplifier alone. In addition, the gain of the current gain means can be selected so that the feedback signal from the current summing node to the compensation node is just canceled by the output signal from the transconductance amplifier input stage, so that the high frequency operation of the amplifier circuit will be dominated by the transconductance amplifier.

DETAILED DESCRIPTION OF THE PREFERRED EMBODIMENTS

Figure 1:
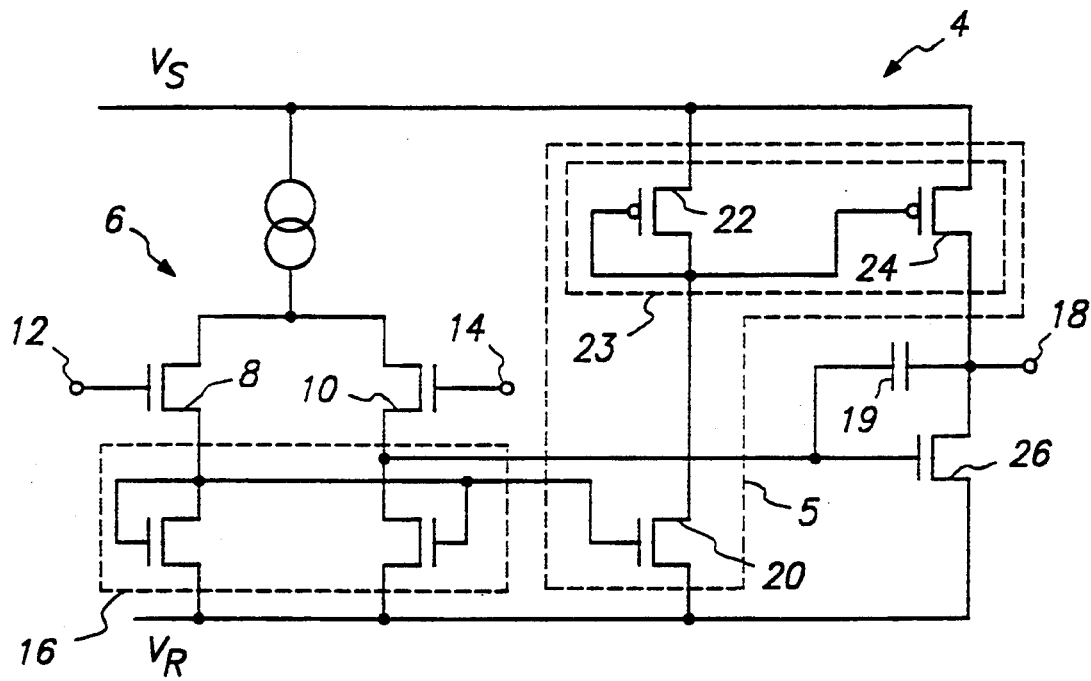
FIG. 1 is a schematic diagram of a conventional class A amplifier having limited DC current capabilities, and improved phase margin from a transconductance path.

Referring to FIG. 1, there is shown a conventional amplifier circuit 4 including a transconductance amplifier input stage 6, current gain means 5, and output transistor 26, which forms a class A output stage. Transconductance amplifier input stage 6 comprises differentially connected transistors 8, 10, the gates of which form inverting input 12 and non-inverting input 14. A current mirror load 16 is connected to the drains of differentially connected input transistors 14, 16. The current gain means 5 includes a gain transistor 20, which is driven from the drain of input transistor 8, and a current mirror 23 which is formed by diode connected transistor 22 and output transistor 24. Output transistor 26 provides active class A operation. The gates of gain transistor 20 and output transistor 26 are biased to provide quiescent current for output transistor 26, with gain transistor 20 operating through current mirror 23. Output 18 is formed by the common connection of the drains of output transistors 24, 26 and is coupled to the drain of input transistor 10 through capacitor 19.

For AC signals applied between inputs 12, 14, signals from the drain of input transistor 10 of transconductance amplifier input stage 6 may be coupled directly to output 18 through current gain means 5. However, when a load coupled to output 18 moves output 18 towards reference voltage $V_r$ or sinking large DC currents, output transistor 26, diode connected transistor 22, and input transistors 8, 10, must operate far from their bias points. In particular, when a load sinks large DC currents from output 18, the current provided by amplifier circuit 4 will be limited by current mirror 16 to approximately twice the quiescent current.

Figure 2:
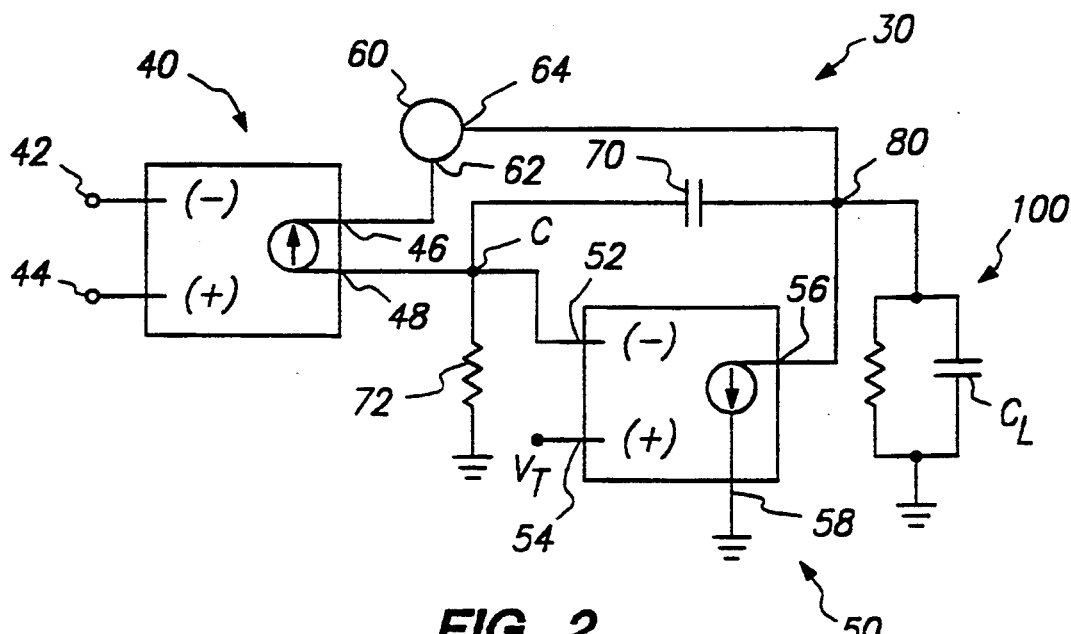
FIG. 2 is a schematic diagram of an amplifier circuit in accordance with the present invention.

Referring now to FIG. 2, there is shown a schematic diagram of an equivalent circuit representation of an amplifier circuit 30 in accordance with the present invention. Amplifier circuit 30 includes a transconductance amplifier input stage 40, a class AB gain stage 50, a current gain means 60, and a compensation capacitor 70. Transconductance amplifier input stage 40 has an inverting input 42, a non-inverting input 44, and first and second current outputs 46, 48, respectively. A load means 72 is connected between second output 48 of transconductance amplifier 40 and reference voltage, $V_r$.

Class AB gain stage 50 has an inverting input 52, non-inverting input 54, and first and second current outputs 56, 58, respectively. Non-inverting input 54 is connected to a reference voltage, $V_t$, while inverting input 52 is connected to the common connection of load means 72 and second output 48 of transconductance input stage 40 to form a compensation node C. First current output 56 is connected to an output 80 of amplifier circuit 30 and second current output 58 is connected to $V_r$. Output 80 and compensation node C are connected by compensation capacitor 70, which provides feedback signals to compensation node C.

Current gain means 60 has an input 62 connected to first output 46 of transconductance amplifier 40 and an output 64 connected to output 80 of amplifier circuit 30 to form a current summing output node.

For high frequency signals applied between inverting and non-inverting inputs 42, 44, respectively, of amplifier circuit 30, output 80 may be driven directly by current gain means 60. In one embodiment of the invention, the gain of current gain means 60, $g_c$, is selected so that the ratio of the capacitance $C_l$ of a load 100 driven by output 80 to the capacitance of compensation capacitor 70 is given by:

$$g_c \approx (C_l/C_c) + 1 \quad \text{(Eq. 1)}$$

When this condition is satisfied, current provided through current gain means 60 to output 80 is distributed between $C_l$ and $C_c$ so that the voltage at node C, $V_c$, does not move. The condition specified by Eq. 1 means that amplifier circuit 30 can respond to AC signals with a slew rate that is substantially equal to that of transconductance amplifier input stage 40. Since transconductance amplifier input stages 40 typically have phase margins on the order of 90°, amplifier circuit 30 with $g_c$ selected in accordance with Eq. 1 will likewise have a phase margin on the order of 90°. Further, since node C does not slew in response to current from transconductance stage output 48, its impedance is effectively zero, and since amplifier output 80 moves without a change in the voltage at node C, the gain of transistor 168 (FIG. 3) is effectively infinite.

Under the balanced condition represented by Eq. 1, $V_c$ is just the bias voltage of class AB amplifier 50 corresponding to the quiescent current that flows between current gain means 60 and ground. However, when load 100 draws DC current, the voltage at output 80 will drop and the voltage at compensation node C, $V_c$, will follow as DC current flows through transconductance amplifier input stage 40 and current gain means 60. However, once $V_c$ drops below threshold voltage $V_t$, the current output of class AB amplifier gain stage 50 is reversed and class AB amplifier gain stage 50 begins sourcing current to load 100 through amplifier circuit output 80. The DC current flow provided by class AB amplifier 50 counteracts the voltage drop at output 80 and, subsequently, at compensation node C. When the current demand of load 100 falls off, $V_c$ approaches and then surpasses $V_t$, and the current sourced to load 100 by class AB amplifier 50 falls towards zero.

Figure 3:
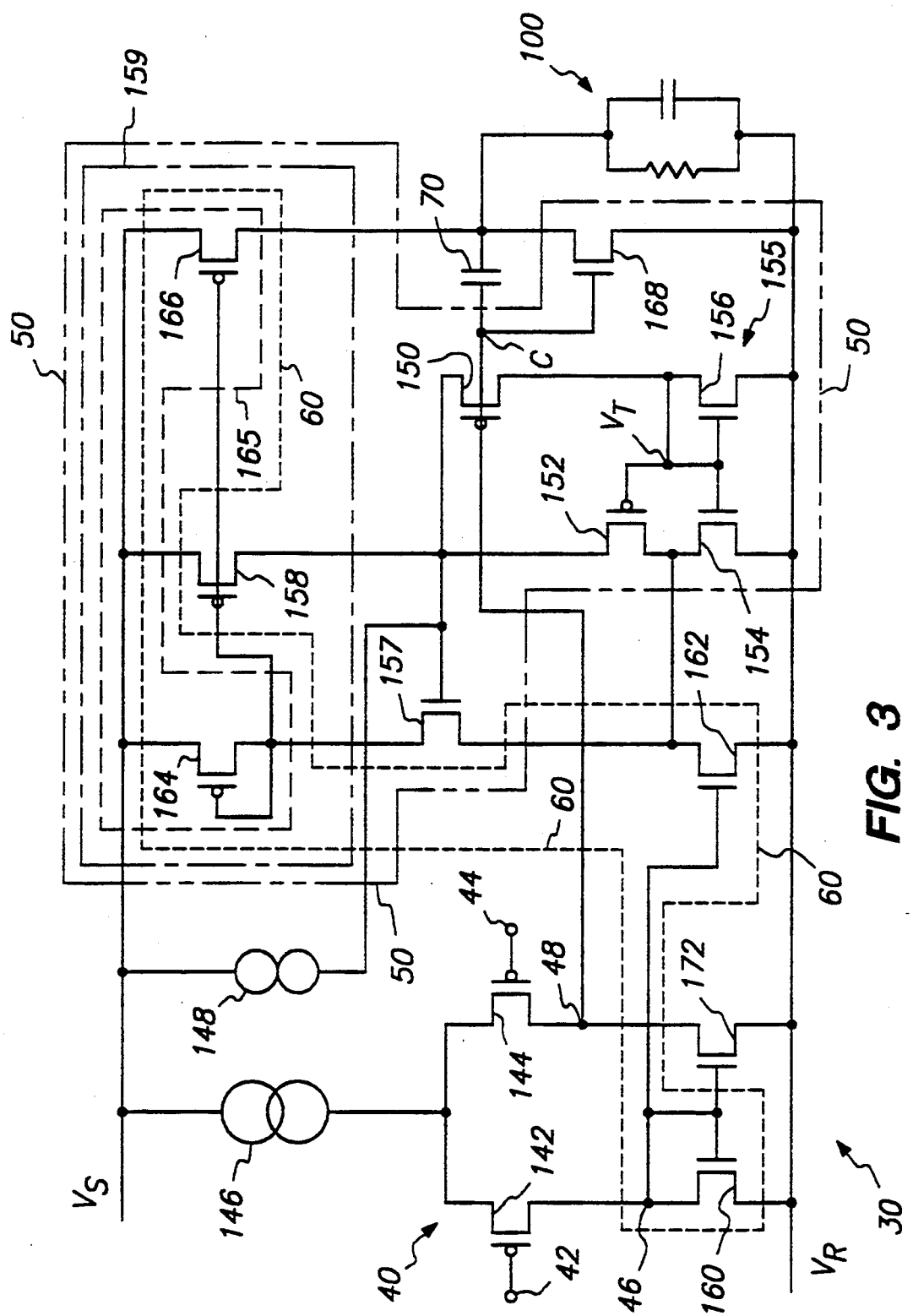
FIG. 3 is a detailed schematic diagram of an amplifier circuit in accordance with the present invention.

Referring now to FIG. 3, there is shown a detailed schematic diagram of one embodiment of an amplifier circuit 30 in accordance with the present invention. In the embodiment of FIG. 3, transconductance amplifier input stage 40 comprises a pair of differentially connected PMOS transistors 142, 144 and a current source 146 which provides bias current to transistors 142, 144. An active load transistor 172, corresponding to load means 72 of FIG. 2, has its drain connected to the drain of transistor 144, which forms output 48 of transconductance amplifier input stage 40. Active load transistor 172 doubles the output transconductance of output 48. Output 46 of transconductance amplifier input stage 40 is formed by the drain of transistor 142, which is connected to the drain of a second load transistor 160. Load transistors 160, 172 have their gates connected together and to drain of load transistor 160 to form a first current mirror 161, which serves as an active load for transconductance amplifier input stage 40.

Current gain means 60 comprises load transistor 160 operating in conjunction with a first, second, and third gain transistors 162, 164, 166, respectively. Gain transistor 162 and load transistor 160 are of conductivity type N while gain transistors 162, 164 are of conductivity type P. The drain of load transistor 160 is connected to the gate of first gain transistor 162, which has its source connected to $V_r$ and its drain connected to the drain of second gain transistor 164, through a current coupling transistor 157. The gate of second gain transistor 164 is connected to its drain and to the gate of third gain transistor 166 and the sources of second and third gain transistors are connected to supply voltage $V_s$ so that gain transistors 164, 166 form a current mirror 165. The drain of transistor 166, which is connected to amplifier circuit output 80, corresponds to output 64 of current gain means 60, while the drain of load transistor 160 corresponds to input 62 of current gain means 60.

With this configuration for current gain means 60, drain current produced in first gain transistor 162 in response to the drain current of second load transistor 160 is mirrored to amplifier circuit output 80 by current mirror 165. The nominal gain of this embodiment of current gain means 60 is:

$$g_c = \tfrac{1}{2}[(g_{150}/g_{152}) + 1](g_{162}g_{166})/(g_{160}g_{164}). \quad \text{(Eq. 2)}$$

In addition, the current gain $g_c$ decreases with $V_c$, allowing the increase in $g_{168}$ to provide phase margin. Thus, the parallel configuration of transconductance input stage 40 and class AB amplifier gain stage 50 improves the phase margin of amplifier circuit 30 over a range of values of $g_c$ about the nominal value of $g_c$ of Eq. 1.

Class AB amplifier gain stage 50 comprises an input transistor 150, an output transistor 168, a current mirror 155, a source voltage regulating transistor 152, current coupling/voltage blocking transistor 157, a second current source 148, and a dual output current mirror 159. The gates of P-type input transistor 150 and P-type source voltage regulating transistor 152 form inverting input 52 and non-inverting input 54, respectively, of class AB amplifier 50. Thus, the gate of input transistor 150 is connected to output 48 of transconductance amplifier input stage 40 and to the gate of output transistor 168. The drain of input transistor 150 is connected to an input of current mirror 155, the output of which is connected to the drain of source voltage regulating transistor 152 and the source of current coupling/voltage blocking transistor 157. The sources of input transistor 150 and source voltage regulating transistor 152 are connected to the gate of current coupling/voltage blocking transistor 157 and current source 148, which provides quiescent current to push pull amplifier 50. Current mirror 155 comprises N type transistors 154, 156. In this embodiment of the invention, the reference voltage $V_t$ applied to the gate of source voltage regulating transistor 152 is provided by the drain of input transistor 150.

Dual output current mirror 159 comprises a current mirror transistor 158 and gain transistors 164, 166 of current mirror 165, the gate of current mirror transistor 158 being connected to the gates of gain transistors 164, 166 and its source being connected to supply voltage $V_s$. The drain of current mirror transistor 158 forms one output of dual output current mirror 159 and is connected to the drains of input transistor 150 and current coupling/voltage blocking transistor 152. The drain of gain transistor 166 forms the second output of dual current mirror 159 and is connected to output 80 to provide an output current determined by the drain current in gain transistor 164.

With the configuration described above for class AB gain stage 50, the drain current of gain transistor 164 is the sum of the drain current of gain transistor 162 and the current at the output of current mirror 155, where the latter current is controlled by input transistor 150. Thus, class AB amplifier 50 provides drain current in gain transistor 164 in addition to that provided by gain transistor 162, the additional drain current being determined by the compensation voltage $V_c$ at the gate of input transistor 150. This additional current is mirrored to amplifier circuit output 80 by dual output current mirror 159 where it adds to the current provided by means of current mirror 165, increasing the DC current available to drive load 100.

Figure 4:
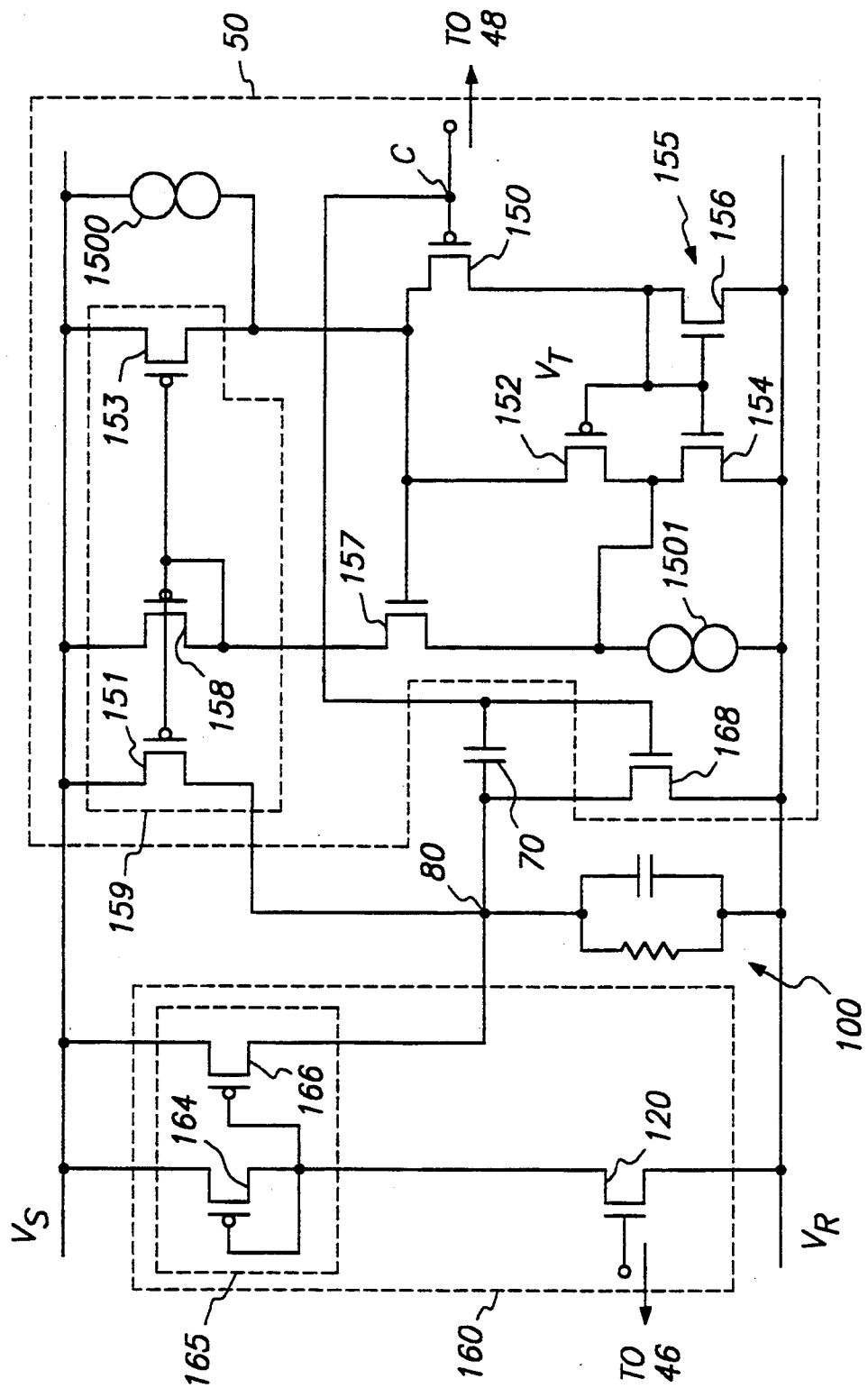
FIG. 4 is a detailed schematic diagram of alternative embodiments of a class AB gain stage and a current gain means for an amplifier circuit in accordance with the present invention.

Referring now to FIG. 4, there is shown an alternative embodiment of class AB gain stage 50 and current gain means 60 of amplifier circuit 30 in which dual output current mirror 159 of class AB gain stage 50 and second current mirror 165 of current gain means 60 are separate circuit elements. In this configuration, current mirror 159 comprises current gain transistors 151, 153 in addition to current gain transistor 158, with the drain of current mirror transistor 151 connected to output 80 to provide the additional drive current generated by push pull amplifier 50. While the relation of current mirrors 159, 165 to push pull amplifier 50, current gain means 60, and output 80 may be clearer in the circuit of FIG. 4, this circuit has the disadvantage of using more transistors than the circuit described above in conjunction with FIG. 3. Further, it removes the interaction between $V_c$ and $g_c$ which occurs in the amplifier 30 of FIG. 3 and is represented by the term, $\frac{1}{2}((g_{150}/g_{152})+1)$, in Eq. 2.

Amplifier circuit 30 thus provides a means for generating a low distortion signal capable of delivering high power efficiency to a load driven from current summing output node 80. Amplifier circuit 30 operates by converting an input signal to a pair of complimentary output currents by means of transconductance input stage 40. One of the complimentary output currents is amplified by current gain means 60 as described above, and applied to current summing output node 80. The other complimentary output current generates a compensation voltage $V_c$ at node C by means of active load transistor 72. The difference between $V_c$ and a reference or bias voltage is used to generate a third current by means of class AB gain stage 50. The third current is applied to current summing output node 80 and a sample of the signal at current summing output node 80 is coupled back to node C, adjusting $V_c$ in accordance with the signal at current summing output node 80.

Figure 5:
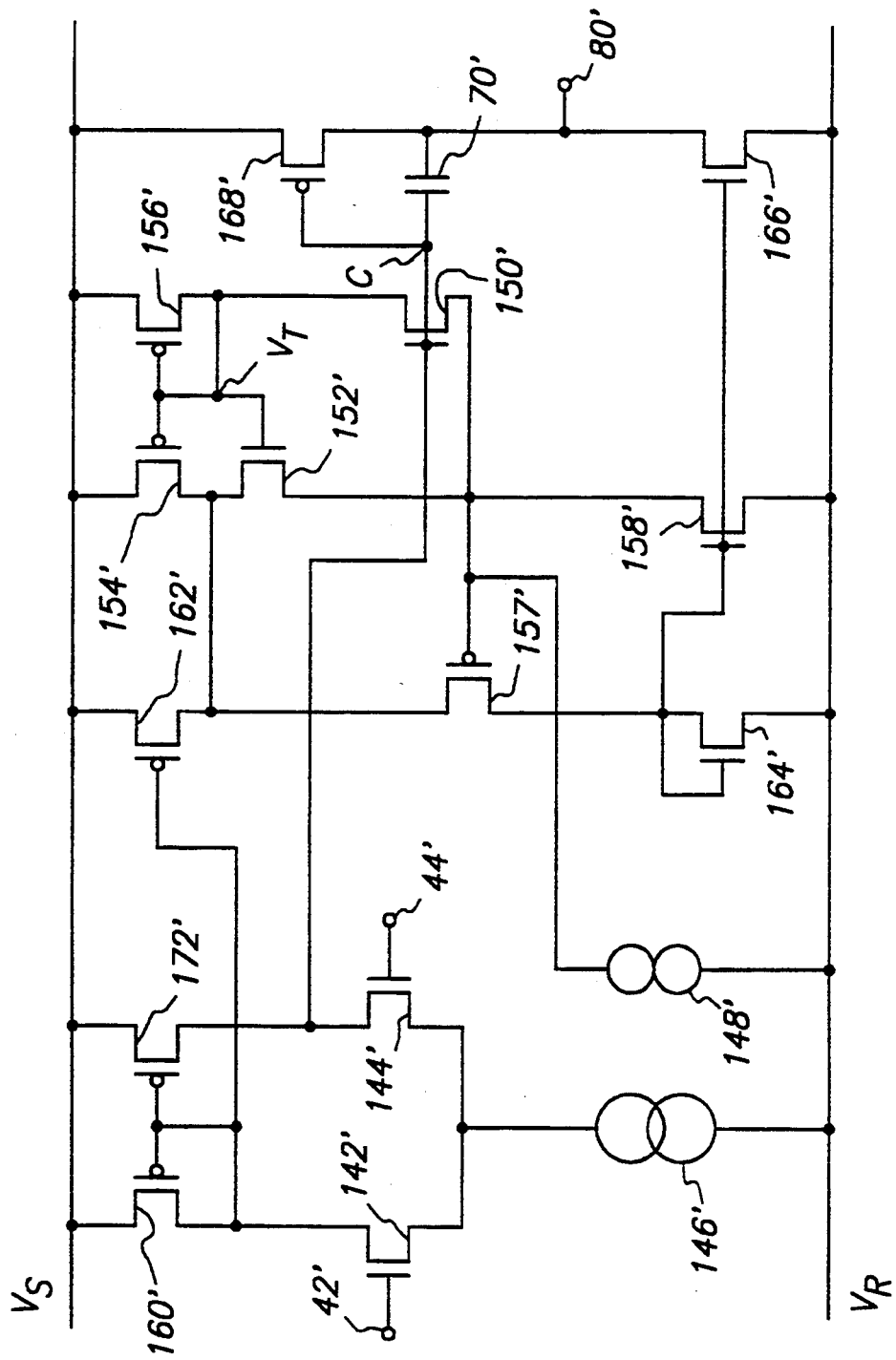
FIG. 5 is a detailed schematic diagram of an amplifier circuit in accordance with the present invention which is complimentary to the amplifier circuit of FIG. 3.

Referring now to FIG. 5, there is shown an amplifier circuit 30 in accordance with the present invention in which the conductivity types of all transistors have been reversed. Amplifier circuit 30 of FIG. 5 is complimentary to amplifier circuit 30 of FIG. 3. Corresponding devices are labelled by corresponding primed ("'") numbers.

Amplifier circuit 30 has been discussed in terms of CMOS transistors. However, amplifier circuit 30 may be realized using bipolar transistors or transistors based on other semiconductor technologies to improve the phase margin to acceptable values below 90°.

Therefore an amplifier circuit has been presented in accordance with the present invention, which amplifier circuit combines the phase margin of a transconductance amplifier with the DC current delivery of a push pull amplifier. The amplifier operates by coupling the current gain output of a transconductance amplifier input stage to slew the amplifier output independently of a compensation capacitor, and using the voltage at the output of the transconductance amplifier input stage to drive the input of a class AB gain stage. In this way, any tendency of the voltage on the compensation capacitor to change in response to DC current demand from the load will cause the push pull amplifier to generate additional current into the load.

What is claimed is:

1. A class AB amplifier circuit having improved phase margin, the amplifier circuit comprising:

a transconductance amplifier input stage having non-inverting and inverting inputs and first and second outputs, for generating signals at the first and second outputs in response to a voltage applied between the inverting and non-inverting inputs;

a first load means having a load input and a load output, the load input being connected to the first output of the transconductance amplifier input stage and the load output being connected to a reference voltage, to form a compensation node at the common connection of the first output and the load input;

current gain means having an input and an output, the input being connected to the second output of the transconductance amplifier input stage and the output being connected to a current summing output node, for providing an increased current transconductance path from the transconductance amplifier input to the current summing output node to couple a first output current to the current summing output node in response to a signal at the inputs of the transconductance amplifier input stage;

a class AB gain stage having an input connected to the compensation node and an output connected to the current summing output node, for sourcing and sinking a second output current at the current summing output node in response to a voltage signal at the compensation node; and a compensation capacitor connected between the compensation node and the current summing node, for providing feedback to the compensation node, the amplifier circuit being effective to provide high frequency response at the current summing output node that is dominated by the transconductance input stage and DC current drive provided by the class AB gain stage.

2. The amplifier circuit of claim 1, wherein the transconductance amplifier input stage is a pair of differentially connected transistors, each transistor having a gate, drain, and source, the sources of the transistors being connected to a common current source, the gates of the transistors forming the non-inverting and inverting inputs of the transconductance amplifier, and the corresponding drains of the transistors forming the first and second current outputs, respectively, of the transconductance amplifier input stage.

3. The amplifier circuit of claim 1, wherein the current gain means comprises a second load means and first, second, and third gain transistors, each gain transistor having a gate, drain, and source and the first gain transistor having opposite conductivity type to the second and third gain transistors, the second load means having a load input connected to the second output of the transconductance amplifier and a load output connected to the reference voltage, the first gain transistor having its gate connected to the common connection of the second load means and the second output of the transconductance amplifier input stage, and its source connected to the reference voltage, the second gain transistor having its gate connected to its drain, its drain connected to receive current from the drain of the first gain transistor, and its source connected to a supply voltage, and the third gain transistor having its gate connected to the gate of the second gain transistor, its source connected to the supply voltage, and its drain connected to the current summing output node, the second and third gain transistors forming a first current mirror for generating increased current at the current summing output node in response to a signal at the second output of the transconductance amplifier input stage.

4. The amplifier circuit of claim 3, wherein the first and second load means are first and second load transistors, each having a gate, drain, and source, the drain and source of each of the first and second load transistors forming the load input and load output, respectively, of the first and second load means, the second load transistor having its gate connected to its drain and to the gate of the first load transistor, to form a second current mirror.

5. The amplifier circuit of claim 4, wherein the gains of the second load transistor, and the first, second, and third gain transistors are selected so that a gain factor equal to the ratio of the product of the gains of the first and third gain transistors to the product of the gains of the second load transistor and the second gain transistor is approximately the same order of magnitude as one plus the ratio of the capacitance of a load connected to the current summing node to the capacitance of the compensation capacitor.

6. The amplifier circuit of claim 4, wherein the class AB gain stage comprises;

an input transistor having a gate, drain, and source, and having opposite conductivity type to the load transistors, the gate of the input transistor forming the input of the class AB gain stage;

a first output transistor having a gate, drain, and source, and having its gate connected to the compensation node, its drain forming the output of the class AB gain stage, and its source connected to the reference voltage;

a current coupling/voltage blocking transistor having a gate, drain, and source, and having the opposite conductivity type of the input transistor, the current coupling/voltage blocking transistor having its gate connected to the source of the input transistor;

a third current mirror, having its input connected to the drain of the input transistor, and its output connected to the source of the current coupling/voltage blocking transistor;

a source voltage regulating transistor having a gate, drain, and source, and having the same conductivity type as the input transistor, the source voltage regulating transistor having its source connected to the source of the input transistor, its drain connected to the output of the third current mirror, and its gate connected to the bias voltage; and a dual output current mirror having a current input and two current outputs, the current input being connected to the drain of the current coupling/voltage blocking transistor, the first current output being connected to the source of the input transistor, and the second current output being connected to the current summing node for sourcing current to the current summing node or sinking current from the current summing node in response to the second voltage signal applied to the gate of the input transistor.

7. The amplifier circuit of claim 6, wherein the bias voltage to which the gate of the source voltage regulating transistor is connected is a voltage at the drain of the input transistor.

8. The amplifier circuit of claim 7, wherein the dual output current mirror comprises first, second, and third current mirror transistors each having a gate, drain, and source, the sources of each current mirror transistor being connected to the supply voltage and the gates of each current mirror transistor being connected together, the first current mirror transistor having its gate connected to its drain and to the drain of the current coupling/voltage regulating transistor, the drain of the second current mirror transistor forming the first output of the current mirror, and the drain of the third current mirror transistor forming the second output of the current mirror.

9. The amplifier circuit of claim 8, wherein the second gain transistor and the third gain transistors are the first and third current mirror transistors of the dual output current mirror and the drain of the first gain transistor is connected to the drain of the second gain transistor through the current coupling/voltage regulating transistor of the class AB gain stage.

10. The amplifier circuit of claim 9, wherein the gains of the second load transistor, and the first, second, and third gain transistors are selected so that the product of a first gain factor equal to the ratio of the product of the gains of the first and third gain transistors to the product of the gains of the second load transistor and the second gain transistor and a second gain factor equal to one quarter of the sum of one and the ratio of the gains of the input transistor and the source voltage regulating transistor is approximately the same order of magnitude as one plus the ratio of the capacitance of a load connected to the current summing node to the capacitance of the compensation capacitor.

11. A method for generating a signal having low distortion and capable of providing high power efficiently to a load driven by an output node, the method comprising the steps of:

generating a pair of complimentary current signals from an input signal;

amplifying one of the complimentary current signals;

applying the amplified current signal to the output node;

generating a compensation voltage at a compensation node from the other complimentary current signal;

generating a third current signal according to the difference between the compensation voltage and a bias voltage;

coupling the third current signal to the output node; and capacitively coupling a sample of the signal at the output node to the compensation node, to adjust the third current signal according to the signal at the output node.

12. The method of claim 11, wherein the step of amplifying one of the complimentary output currents further comprises the steps of:

determining the capacitance of the load; and amplifying the complimentary current signal by an amount sufficient to offset a change in the compensation voltage due to the capacitively coupled sample of the signal at the output node when the amplified signal is applied to the output node.

* * * * *